United States Patent
Dadkhah et al.

(10) Patent No.: US 7,956,347 B2
(45) Date of Patent: Jun. 7, 2011

(54) INTEGRATED MODULATING RETRO-REFLECTOR

(75) Inventors: Mahyar Dadkhah, San Diego, CA (US); Tony Maryfield, Poway, CA (US); Thomas Davidson, Santee, CA (US)

(73) Assignee: Cubic Corporation, San Diego, CA (US)

( * ) Notice: Subject to any disclaimer, the term of this patent is extended or adjusted under 35 U.S.C. 154(b) by 523 days.

(21) Appl. No.: 12/171,837

(22) Filed: Jul. 11, 2008

(65) Prior Publication Data

US 2009/0034047 A1 Feb. 5, 2009

Related U.S. Application Data

(60) Provisional application No. 60/949,229, filed on Jul. 11, 2007, provisional application No. 60/949,230, filed on Jul. 11, 2007, provisional application No. 60/949,200, filed on Jul. 11, 2007.

(51) Int. Cl.
*H01L 29/06* (2006.01)
*H01L 31/0232* (2006.01)
*H01L 23/02* (2006.01)

(52) U.S. Cl. .......... 257/14; 257/436; 257/461; 257/680; 257/E31.113; 257/E23.181

(58) Field of Classification Search ............ 257/14, 257/436, 461, 680, E31.113, E23.181
See application file for complete search history.

(56) References Cited

U.S. PATENT DOCUMENTS

| 4,716,449 A | 12/1987 | Miller |
| 5,136,602 A | 8/1992 | Sugawara |
| 5,144,397 A | 9/1992 | Tokuda et al. |
| 5,306,925 A | 4/1994 | Abe et al. |
| 5,668,386 A | 9/1997 | Makiuchi et al. |
| 5,912,475 A | 6/1999 | Itagaki et al. |
| 6,005,276 A | 12/1999 | Forrest et al. |
| 6,055,087 A | 4/2000 | Kwon et al. |
| 6,154,299 A | 11/2000 | Gilbreath et al. |
| 6,229,165 B1 | 5/2001 | Sakai et al. |
| 6,278,136 B1 | 8/2001 | Nitta |
| 6,438,150 B1 | 8/2002 | Yoo |
| 6,646,292 B2 | 11/2003 | Steigerwald et al. |

(Continued)

FOREIGN PATENT DOCUMENTS

GB 2366872 A 3/2002

(Continued)

OTHER PUBLICATIONS

PCT International Search Report and Written Opinion mailed Nov. 13, 2008, International Application No. PCT/US2008/069888, 14 pages.

(Continued)

*Primary Examiner* — Ngan Ngo
(74) *Attorney, Agent, or Firm* — Kilpatrick Townsend & Stockton, LLP

(57) ABSTRACT

A novel package that integrates components for a modulating retro reflector into a single package is disclosed according to various embodiments. According to some embodiments the package is configured to secure a retro reflector, a quantum well modulator and photodiode. In some embodiments, the package may include interconnects to surface mount to a circuit board. Such interconnects may be coupled with the photodiode and/or the quantum well modulator. In some embodiments, the package may be constructed of liquid crystal polymers and/or may include one or more windows.

19 Claims, 14 Drawing Sheets

U.S. PATENT DOCUMENTS

| | | | |
|---|---|---|---|
| 6,687,268 B2 | 2/2004 | Kitamura et al. | |
| 6,803,604 B2 | 10/2004 | Takahashi et al. | |
| 6,836,351 B2 | 12/2004 | Livingston et al. | |
| 6,845,184 B1 * | 1/2005 | Yoshimura et al. | 385/14 |
| 7,213,942 B2 | 5/2007 | Jiang et al. | |
| 7,333,735 B1 | 2/2008 | Goorjian | |
| 7,522,648 B2 | 4/2009 | Park et al. | |
| 7,679,805 B2 | 3/2010 | Dadkhah et al. | |
| 7,760,782 B2 * | 7/2010 | Aoki | 372/44.01 |
| 2005/0018720 A1 * | 1/2005 | Kish et al. | 372/20 |
| 2006/0054899 A1 | 3/2006 | Takahashi et al. | |
| 2006/0180830 A1 | 8/2006 | Alavi et al. | |
| 2007/0127928 A1 | 6/2007 | Varshneya et al. | |
| 2008/0138088 A1 * | 6/2008 | Welch et al. | 398/183 |
| 2008/0217602 A1 | 9/2008 | Kahen | |

FOREIGN PATENT DOCUMENTS

| | | |
|---|---|---|
| JP | 04263475 A | 9/1992 |
| JP | 2000/299489 A | 10/2000 |
| WO | WO 03075493 A | 9/2003 |

OTHER PUBLICATIONS

PCT International Search Report and Written Opinion mailed Feb. 13, 2009; International Application No. PCT/US2008/069875, 21 pages.

PCT International Search Report and Written Opinion mailed Oct. 10, 2008, Application No. PCT/US2008/069874, 15 pages.

* cited by examiner (Prior art)

US 7,956,347 B2

INTEGRATED MODULATING RETRO-REFLECTOR

CROSS-REFERENCES TO RELATED APPLICATIONS

This application is a non-provisional, and claims the benefit, of commonly assigned U.S. Provisional Patent Application No. 60/949,230, filed Jul. 11, 2007, entitled "Integrated Modulating Retro-Reflector," the entirety of which is herein incorporated by reference for all purposes.

This application is a non-provisional, and claims the benefit, of commonly assigned U.S. Provisional Patent Application No. 60/949,200, filed Jul. 11, 2007, entitled "Flip-Chip Photo-Diode," the entirety of which is herein incorporated by reference for all purposes.

This application is a non-provisional, and claims the benefit, of commonly assigned U.S. Provisional Patent Application No. 60/949,229, filed Jul. 11, 2007, entitled "Flip-Chip Quantum Well Modulator," the entirety of which is herein incorporated by reference for all purposes.

STATEMENT AS TO RIGHTS TO INVENTIONS MADE UNDER FEDERALLY SPONSORED RESEARCH OR DEVELOPMENT

This invention was supported by U.S. Government under an award by Special Operations Command under Contract No. H92222-04-C-0004, which outlines certain rights in the invention given to the U.S. Government.

BACKGROUND

Interrogators often employ modulators and/or reflectors to respond to an interrogating beam of light. The modulator adds a signal to a reflected beam of light, and the reflector directs the interrogating beam of light back toward the light source. Modulating retro reflectors, in general, are becoming smaller, lighter and faster. High data rates can be achieved with fast modulators.

SUMMARY

A modulating reflector assembly is provided according to some embodiments. The assembly ma include a body including an external surface, a flip-chip photodiode coupled with the body, a reflector coupled with the body, and a quantum well modulator disposed between the reflector and the exterior of the body. In some embodiments the substrate of the flip-chip photodiode may be exposed to the exterior of the body. In some embodiments the substrate of the quantum well modulator may be exposed to the exterior of the body. The flip-chip photodiode and the quantum well modulator, in some embodiments, may be configured to receive a light beam from a remote transceiver. The body, for example, may include a liquid crystal polymer. In some embodiments the assembly may include a plurality of interconnects configured to couple the modulating reflector assembly with a printed circuit board. These interconnects may be surface mount interconnects, solder balls, and/or epoxy bumps. In some embodiments, the flip-chip photodiode may be communicatively coupled with one or more of the plurality of interconnects. In some embodiments, the quantum well modulator may be communicatively coupled with one or more of the plurality of interconnects.

Another modulating reflector assembly is provided according to another embodiment. The modulating reflector assembly may include a body, a flip-chip photodiode, a retro reflector, a flip-chip quantum well modulator, and/or a plurality of interconnects. The body may include an external surface and comprising a liquid crystal polymer. The flip-chip photodiode may be coupled with the body with the substrate of the flip-chip photodiode is exposed to the exterior of the body. The retro reflector may be coupled with the body. The flip-chip quantum well modulator may be disposed between the reflector and the exterior of the body such that the substrate of the quantum well modulator is exposed to the exterior of the body. The flip-chip quantum well modulator may also be disposed on the same external surface of the body as the flip-chip photo diode. The plurality of interconnects may be configured to couple the modulating reflector assembly with a printed circuit board.

Another modulating reflector assembly is provided according to another embodiment and may include a body, a flip-chip photodiode, a retro reflector, a flip-chip quantum well modulator and a plurality of interconnects. The body may include an external surface, a first window, and a second window. The flip-chip photodiode may be coupled with the body and disposed relative to the first window such that the substrate of the flip-chip photodiode is exposed to light from the exterior of the body through the first window. The flip-chip quantum well modulator may be disposed between the reflector and the second window such that the substrate of the quantum well modulator is exposed to light from the exterior of the body through the second window. The plurality of interconnects may be configured to couple the modulating reflector assembly with a printed circuit board. In some embodiments, the interconnects may be communicatively coupled with the flip-chip photodiode and/or the quantum well modulator.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope of the invention.

A novel package that integrates components for a modulating retro reflector into a single package is disclosed according to various embodiments. The packaging may be configured to secure components such as reflectors, retro reflectors, modulation sources, photo diodes, flip-chip photodiodes, flip-chip modulating quantum well modulators, electrical components, filters, quantum well modulators, battery power, etc. In some embodiments, the packaging includes a body that comprises a liquid crystal polymer. In some embodiments, the packaging integrates a retro reflector, a quantum well modulator and a photodiode. Moreover, one or more windows may be placed within the packaging from which light may be received by a photo diode and/or retro reflector and/or transmitted by a retro reflector.

In one embodiment, an assembly may include a single window, flip-chip quantum well modulator, a flip-chip photodiode, and a retro-reflector. In some embodiments, the liquid crystal polymer material offers a largely matched coefficient of thermal expansion to the delicate semiconductors and silicon retro and window. In other embodiments the assembly may provide a low profile surface mount package. In other embodiments a lead frame is embedded in the manufacturing process with liquid crystal polymer, acting as an electrical isolator and hermetic mechanical housing. In some embodiments, the housing can be surface mount attached to a circuit card assembly and/or may lend itself to high volume manufacturing and assembly. In some embodiments, a monolithic lead frame may provide a planar circuit connecting a quantum well modulator and a photodiode with individual leads. The monolithic lead frame, in some embodiments, may also incorporates electrical shielding and guard banding to avoid electrical cross-talk between them.

In other embodiments, the components within a disclosed assembly may be thermally matched to avoid warping and/or optical wavefront distortions.

Figure 1A:
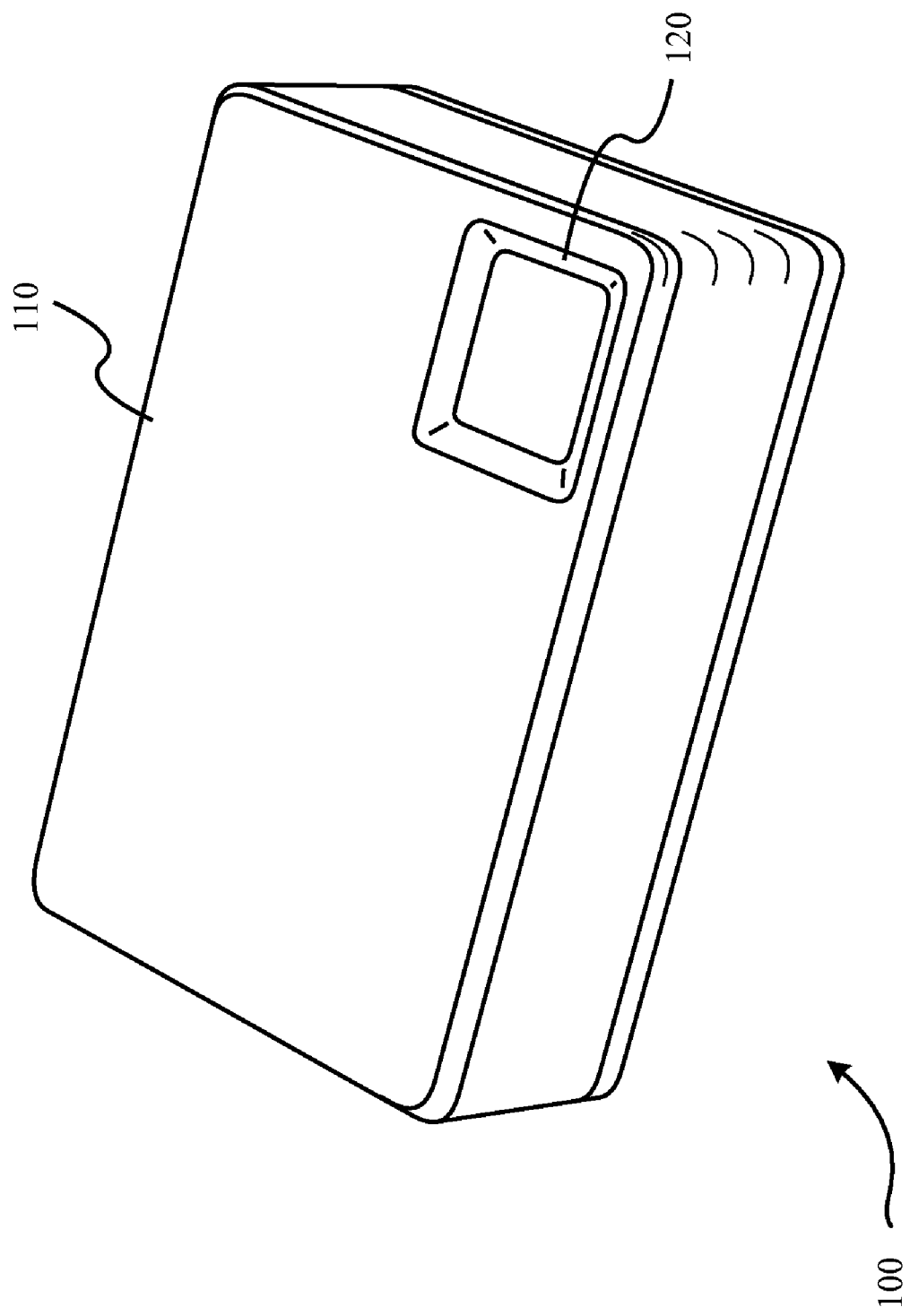
FIGS. 1A-1C show modulating retro reflector housings according to various embodiments.

FIG. 1A shows a modulating retro reflector assembly housing 110 according to one embodiment. The modulating retro reflector assembly 100 includes a housing 110 and single window 120. In some embodiments, the housing 110 may be constructed from liquid crystal polymers. In other embodiments, the housing, may be constructed from various other polymers and/or metal materials, for example, aluminum, plastic, etc. The window may provide light to and from a photodiode and/or a modulating retro reflector assembly.

Figure 1B:
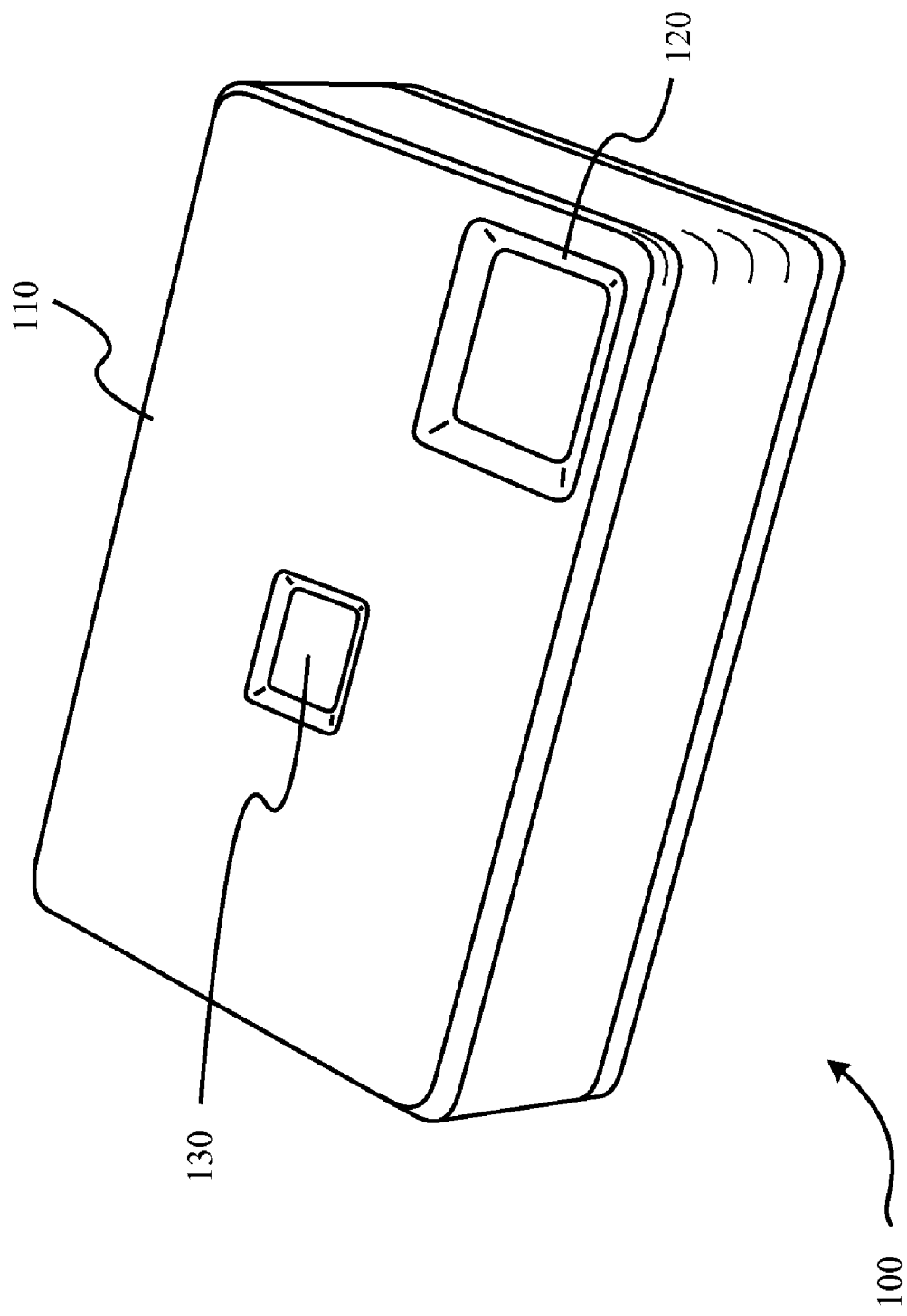

FIG. 1B shows a modulating retro reflector assembly housing 110 with two windows 120, 130 according to one embodiment. One of the windows 120 may provide light to the photodiode, while the other window 130 may provide light to a modulating retro reflector assembly. The windows may be placed in any location on the housing and may be configured to meet the size and shape restraints of the optical elements within the housing.

Figure 1C:
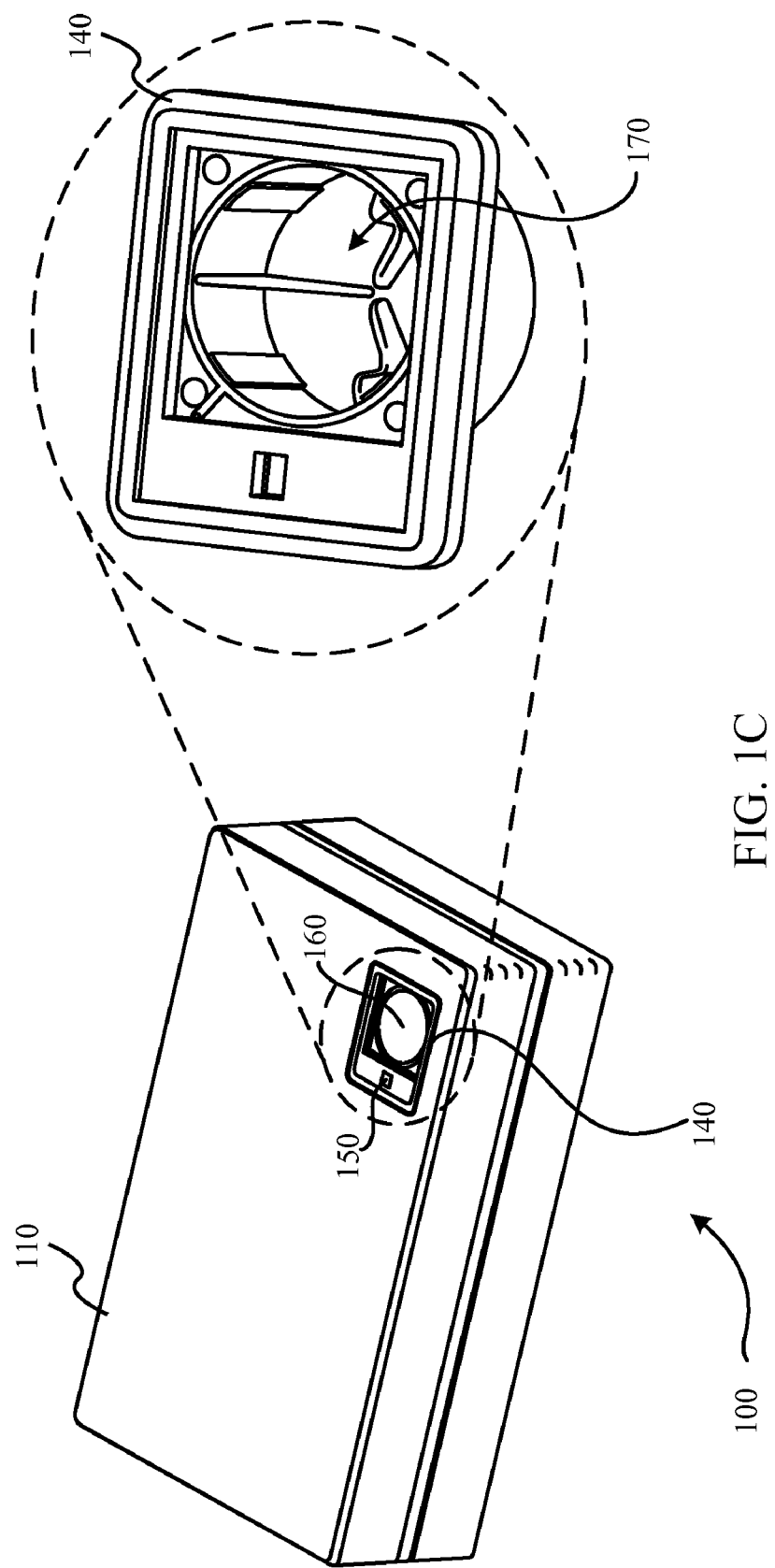

FIG. 1C shows another modulating retro reflector assembly 100 according to some embodiments. The housing 110 includes a photodiode 150 positioned beneath a single window 140. A quantum well modulator 160 is also shown beneath the single window 140. A retro reflector may be positioned beneath the quantum well modulator 160. As shown in the close up view, a structure 170 for securing a retro reflector is provided. The structure 170 may part of the housing 110 or coupled thereto. Thus, while a single window 140 is shown, a separate window may be used for the quantum well modulator and the photodiode. In some embodiments, the quantum well modulator, for example, may include a flip-chip quantum well modulator or other modulating device. In some embodiments, the photodiode may be a flip-chip photodiode.

Figure 2:
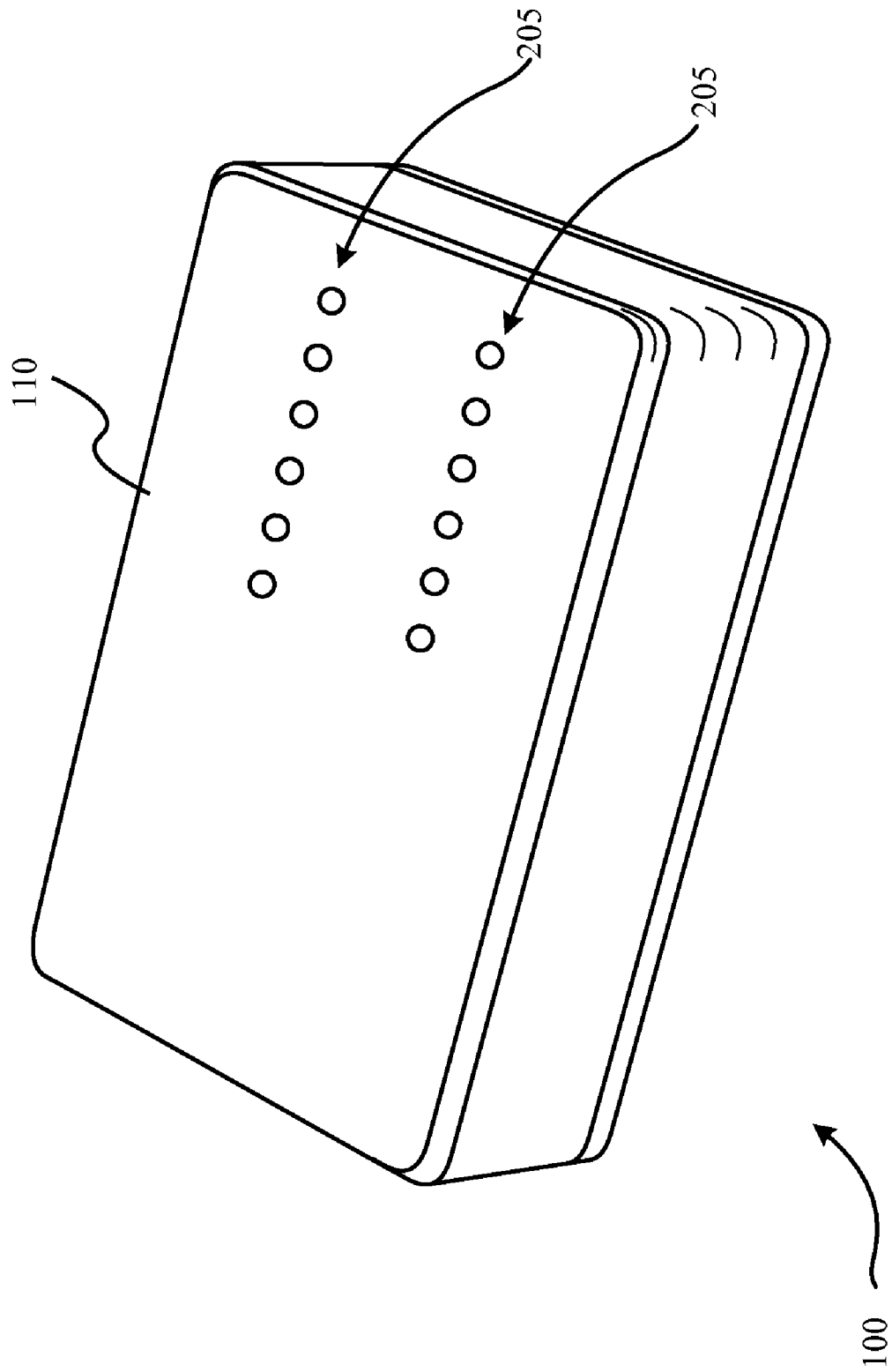
FIG. 2 shows a back surface of a modulating retro reflector housing according to one embodiment.

FIG. 2 shows the back surface of a modulating retro reflector assembly housing 100 according to some embodiments. As shown the housing 110 includes a plurality of epoxy balls 205. These epoxy bumps 205 may be used to surface mount the housing 110 to a printed circuit board. While two arrays of epoxy bumps are shown, any configuration of epoxy bumps may be used. Moreover, any type of interconnect may be used to couple the housing 110 with a printed circuit board. In some embodiments surface mount interconnects may be used. In some embodiments a ball grid array may be used. The interconnects may be electrically coupled, for example, with a photodiode and/or a quantum well modulator. The interconnects may also be used to power a photodiode or quantum well modulator.

Figure 3A:
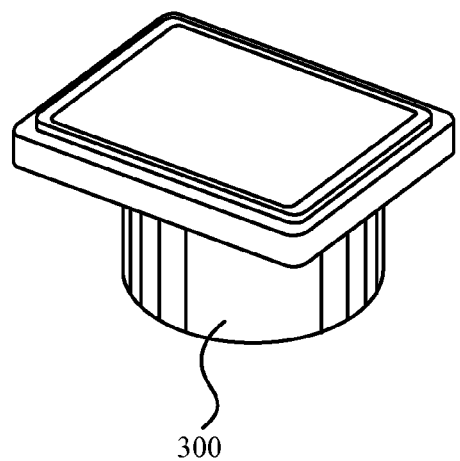
FIGS. 3A and 3B show a flip-chip photodiode used in conjunction with an optical communication device according to one embodiment.
Figure 3B:
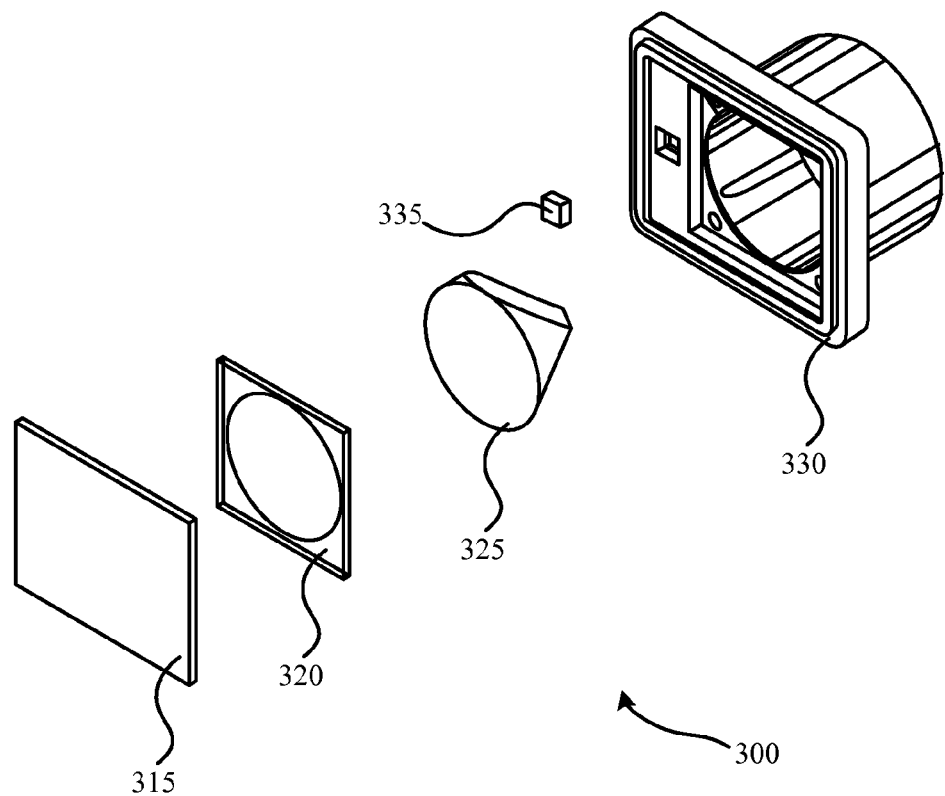

FIG. 3B shows an exploded view of an integrated modulating retro reflector assembly 300 according to one embodiment. A retro reflector housing 330 contains a retro-reflector 325, a modulating quantum well modulator 320, a window 315 and a photodiode 335. The quantum well modulator 320 may modify or add information to the signal before or after reflection through the retro-reflector 325. FIG. 3A shows an unexploded packaged view of the optical communication device.

Figure 4:
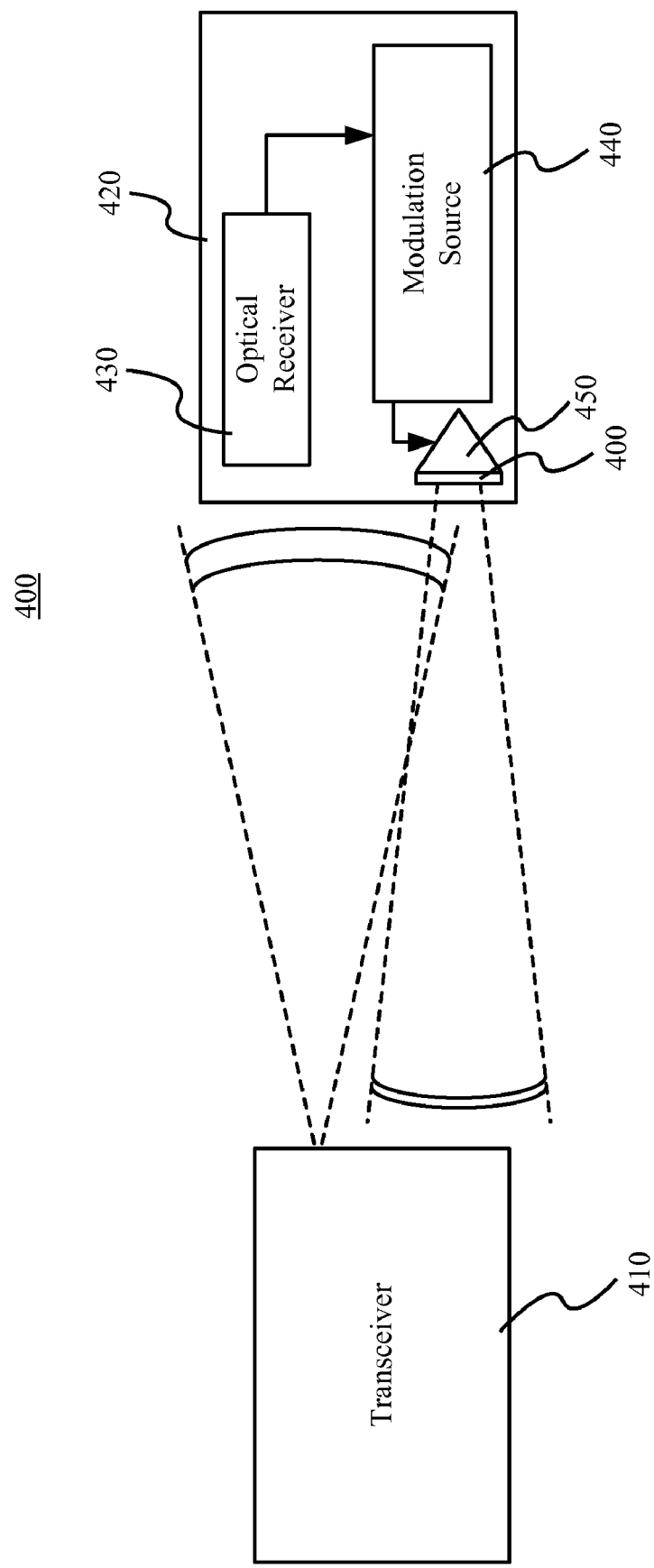
FIG. 4 shows a communication system that may implement a quantum well modulator according to some embodiments.

FIG. 4 shows an optical communication system employing a quantum well modulator according to one embodiment. As shown, transceiver 410 transmits an information bearing optical signal toward an optical tag 420. An optical receiver 430 may be disposed within the optical tag 420 and receives the signal. The optical receiver 430 may include a flip-chip photodiode and may be coupled with a modulation source 440 which may modify or add information to the signal. An output of modulation source 440 is coupled to a reflector 450 for transmission. The reflector 450 may include a retro reflector. In some embodiments, the reflector 450 may include a quantum well modulator 400 coupled thereto. The quantum well modulator may provide modulation to a return signal. In this manner, transceiver 410 and optical tag 420 communicate. According to some embodiments, some of the elements shown within the optical tag 420 may be included within an integrated retro reflector assembly. In other embodiments, optical components may be included within the assembly. In yet other embodiments, a combination of optical and electrical components are included within the assembly.

Figure 5A:
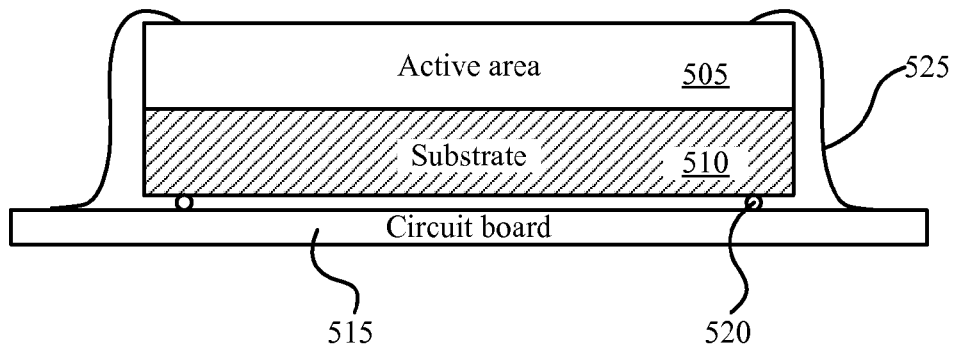
FIG. 5A shows a prior art photodiode.

Referring first to FIG. 5A, a photodiode is shown. As shown, a substrate 510 includes an active area 505 deposited thereon. The substrate 510 is coupled with the circuit board 515 using, for example, solder balls and/or die attach epoxy 520. The active layer 505 is coupled with the circuit board 515 using wire bonds 525. As shown, the active layer 505 is exposed to the incoming light and a filter may be required to cut back on unwanted light sources.

Figure 5B:
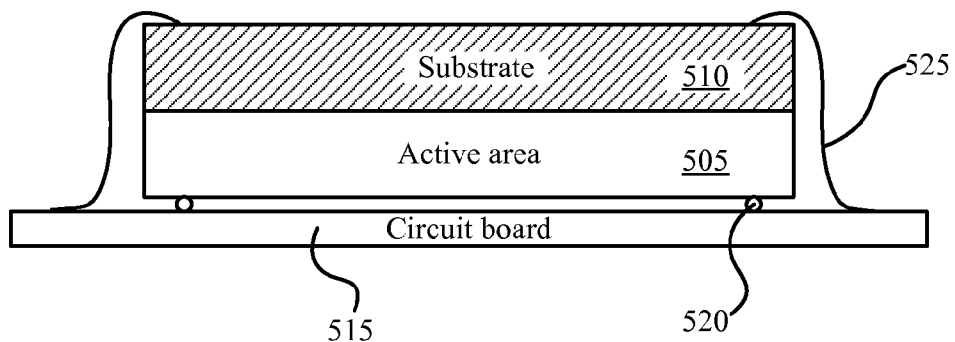
FIG. 5B shows a flip-chip photodiode according to one embodiment.

FIG. 5B shows a flip-chip photodiode that may be assembled within the modulating retro reflector housing according to one embodiment. The photodiode is flipped compared to the photodiode shown in FIG. 5A. That is, the substrate 510 is above the active layer 505. In such an embodiment, only light that transmits through the substrate 510 is incident on the active area 505. Thus, the substrate 510 acts not only as a substrate, but also as a light filter. Such a flip-chip photo diode may be placed within the modulating retro reflector assembly with the substrate facing the exterior of the housing 110.

The substrate 510 may be selected based on the wavelength of light that one is interested in filtering. For example, the substrate may comprise indium phosphide (InP) which permits transmission of wavelengths of the desired wavelength, for example of about 1550 nm, and may block other wavelengths. In some embodiments, the desired wavelength may be between about 1530 nm and 1590 nm. In some embodiments, the substrate 510 may act as a long-pass filter to daylight and may block short wave infrared radiation. In other embodiments, the substrate 510 filters sun light.

The active area 505 may be coupled with solder balls 520 or other connectors used to couple the active area to a circuit board, such as, for example, conductive epoxy bumps. In some embodiments, the active area 505 may include various surface-mount interconnects. These interconnects may include, for example, J-leads, solder balls, pins, fine pitch balls, leads, epoxy bumps, stencil printed polymer bumps, conductive adhesives, stud bumps, etc. Accordingly, the photodiode may be used as a surface-mount device with any type of grid array and/or packaging. In the embodiment shown in FIG. 5B, solder balls 520 may electrically connect the active area 505 with the printed circuit board 515. The substrate, in this embodiment, may use wire bonds to connect the substrate 510 with the circuit board 515.

The substrate 510 may include any semiconductor material. For example, the substrate may comprise indium phosphide, silicon, silicon germanium, and/or indium gallium arsenide. As another example, the active area 505 may include silicon, gallium, indium gallium arsenide, gallium phosphide, silicon carbide, titanium dioxide, germanium, gallium nitride, aluminum gallium nitride, and/or lead sulfide. In some embodiments, the active area 505 comprise a p-type semiconductor material and the substrate 510 comprises an n-type semiconductor material.

The photodiode may comprise any type of photodiode. For example, the photodiode may include a PN photodiode, a PNN photodiode, a PIN photodiode, a Schottky type photodiode, and/or an avalanche type photodiode.

Various embodiments use the substrate as a sunlight filter. Such a filter may eliminate the need for added filter components, which may reduce the photodiode stack height and dimension. Moreover, using the substrate as a sunlight filter reduces the complexity and cost of the photodiode. The sunlight filter also reduces photocurrent within the photodiode according to some embodiments. In other embodiments, the sunlight filter may also reduce power consumption from the photocurrent when the photodiode is reverse biased.

Figure 6A:
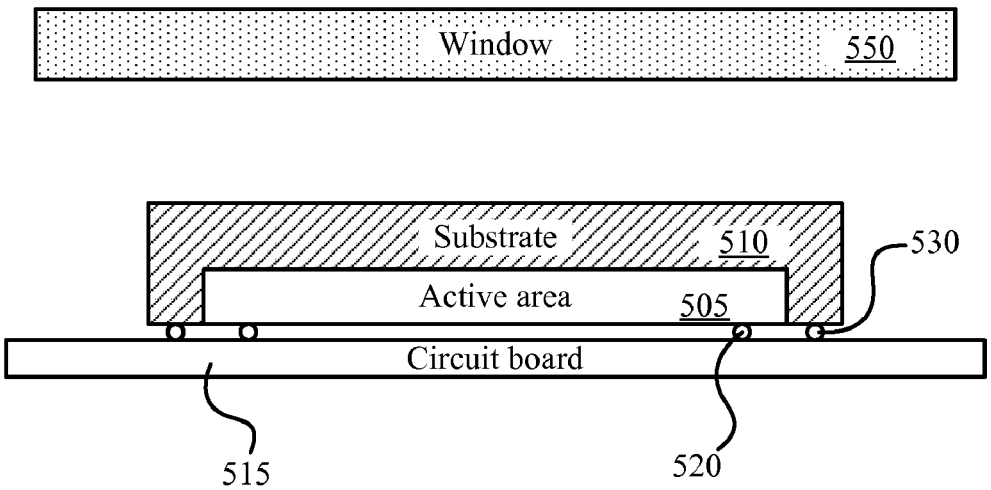
FIGS. 6A-6C show various flip-chip photodiode configurations according to some embodiments.
Figure 6B:
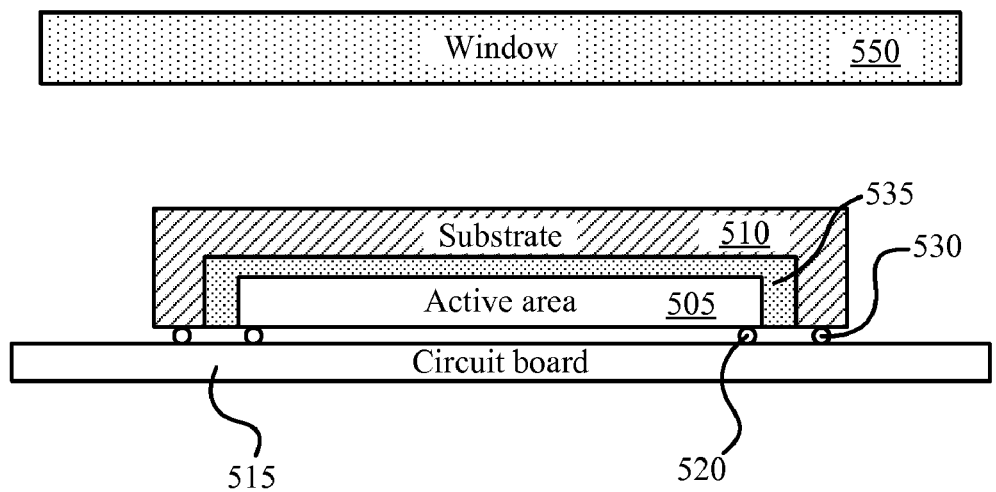
Figure 6C:
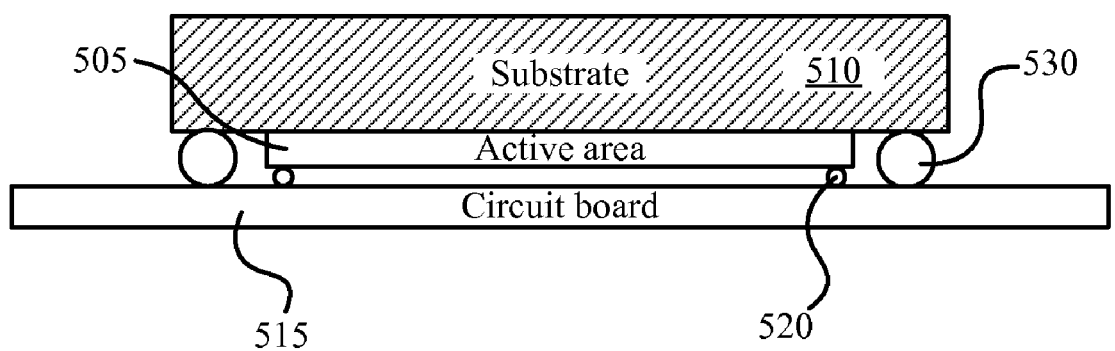

FIGS. 6A and 6B show other flip-chip photodiodes with a window 550 according to some embodiments. The window 550 may provide protection from the elements and/or provide some filtering. Moreover, in FIG. 6A the substrate includes solder balls 530 in a surface mount package. FIG. 6B shows a PIN type photodiode with an intrinsic layer 535 between the substrate 510 and the active area 505. FIG. 6C shows a photodiode with an active area 505 that were constructed using a mesa etch technique according to some embodiments. The edges of the active area 505 may be are protected with a non-conductive layer, such as a passivation layer. In some embodiments, a passivation layer may include benzocyclobutene. In various embodiments, both the N-semiconductor layer and P-semiconductor layer of the photodiode are interconnected with the printed circuit board, for example using epoxy bumps and/or solder.

Figure 7:
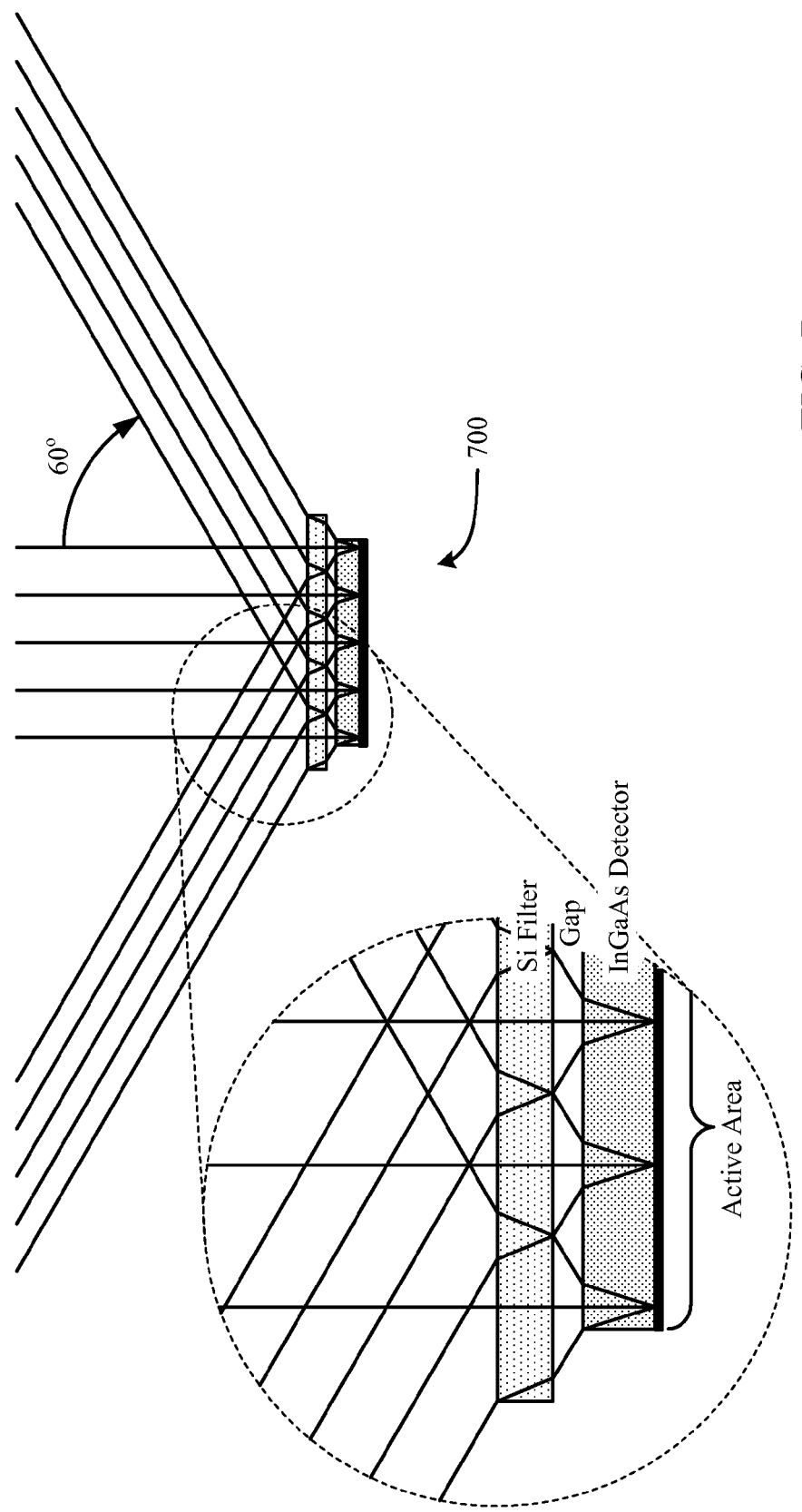
FIG. 7 shows light incident off the active layer of a photodiode according to one embodiment.

FIG. 7 shows a flip-chip photodiode 700 shown with light rays according to one embodiment. As shown, a flip-chip diode according to embodiments described herein, may have about a ±60° field of view. In other embodiments, the field of view, for example, may be about ±50°, ±51°, ±52°, ±53°, ±54°, ±55°, ±56°, ±57°, ±58°, ±59°, ±50°, ±61°, ±62°, 63°, ±64°, ±65°, ±66°, ±67°, ±68°, ±69° or ±70°. In other embodiments, the field of view may be less than about ±50°. As shown in the expanded view portion, an indium gallium arsenide detector may be used with a silicon filter. The active area, for example, may include indium phosphide.

Figure 8:
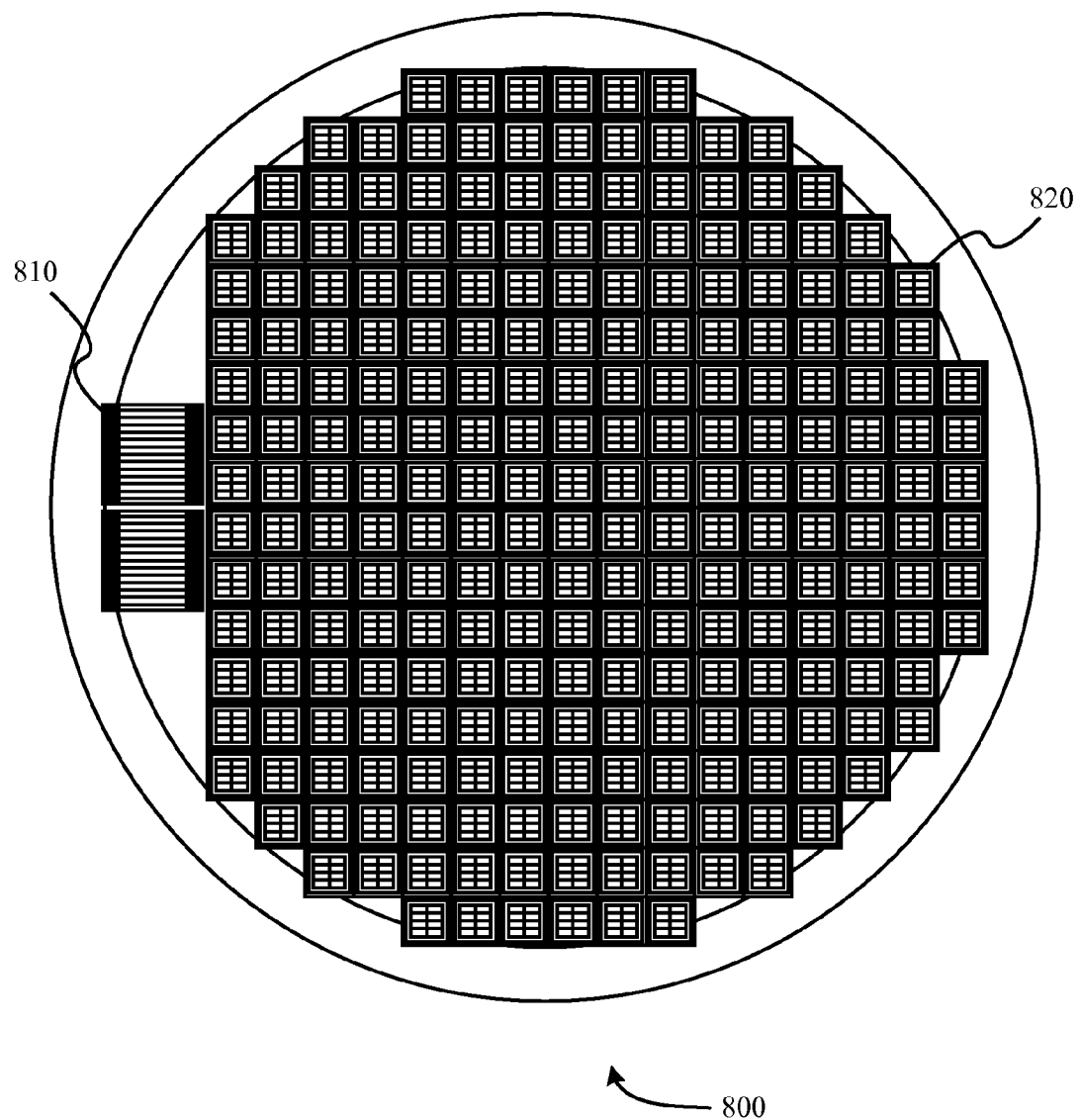
FIG. 8 shows a top view of a photodiode array according to one embodiment.

FIG. 8 shows a top view of a flip-chip photodiode wafer 800 according to one embodiment. The photodiode wafer 800 may include a plurality of photodiodes 820 as shown. Any number of photodiodes may be used within an array. In this embodiment, two quality control test sites 810 are included.

Figure 9:
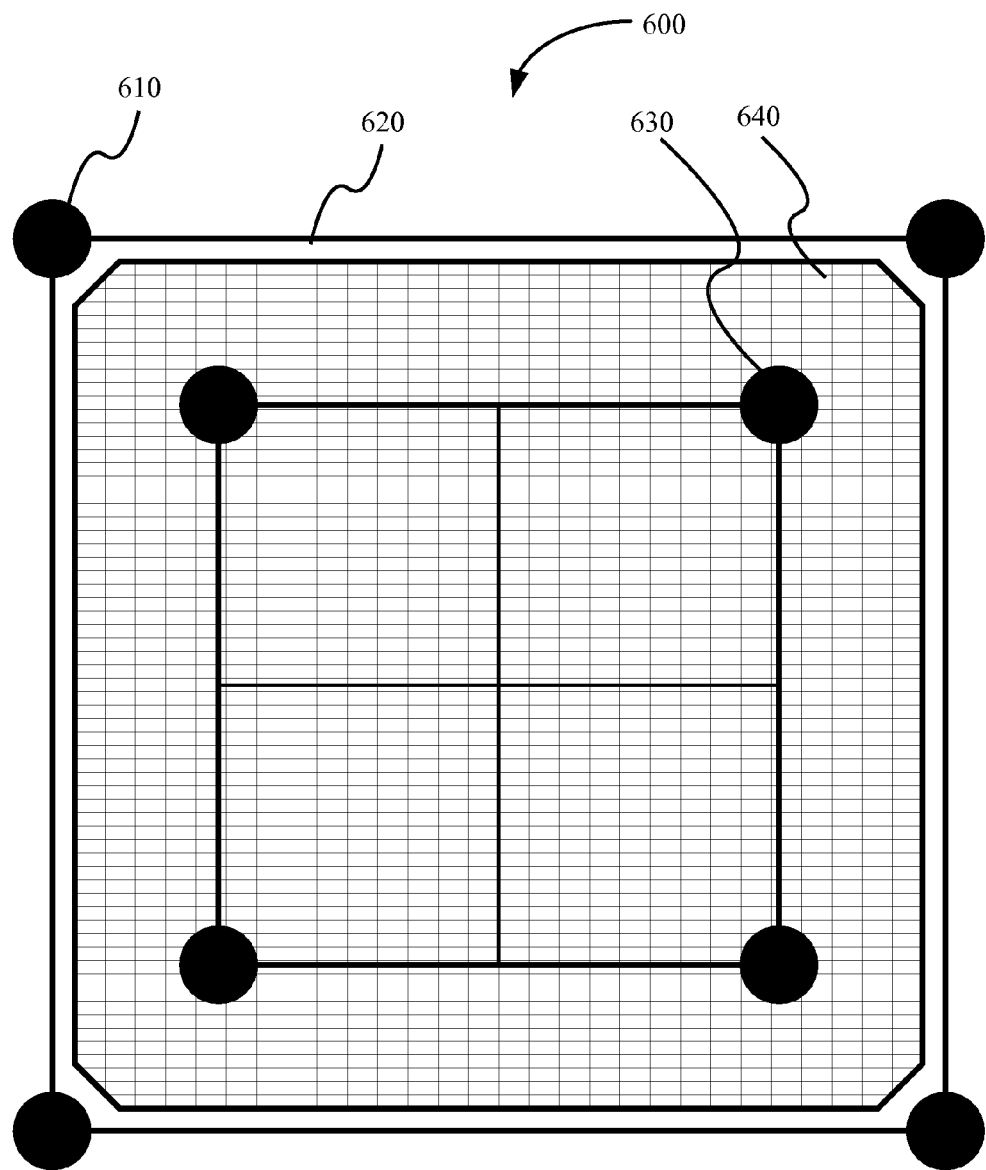
FIG. 9 shows a bottom view of a photodiode according to one embodiment.

FIG. 9 shows a bottom view of a surface mount package flip-chip photodiode 900 according to one embodiment. The active area 940 is shown surrounded by the substrate 920. Solder balls 930 are coupled with the active area 940 and solder balls 910 are coupled with the substrate 920.

Figure 10:
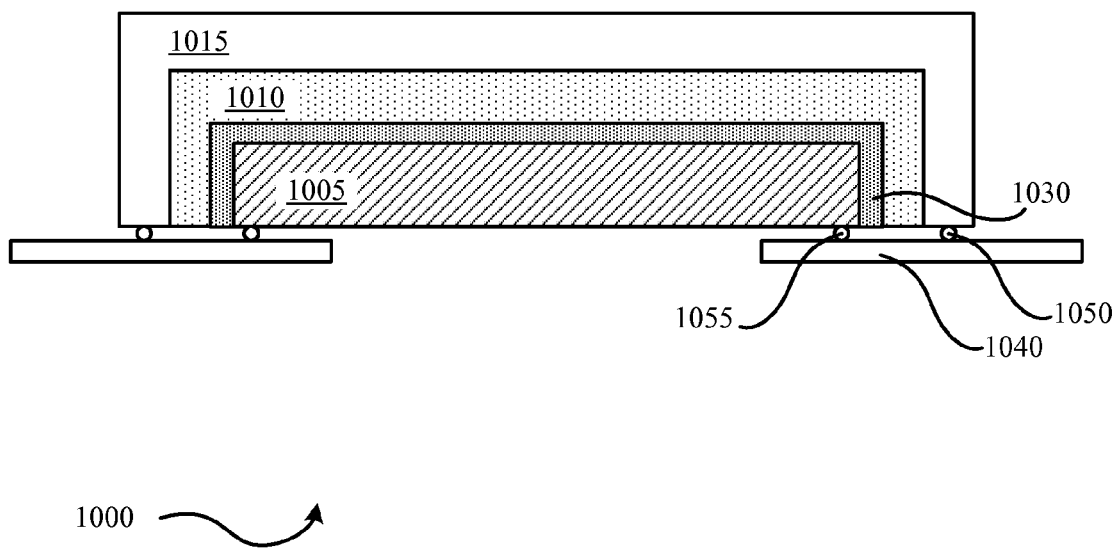
FIG. 10 shows a side view of a quantum well modulator according to one embodiment.

FIG. 10 shows a side view of a quantum well modulator 1000 according to one embodiment. The quantum well modulator 1000 includes a number of layers deposited on a substrate 1015. In some embodiments, the layers may be deposited using, for example, molecular beam epitaxy or metal oxide chemical vapor deposition. Various other deposition techniques may be used. The layers may include an n-type semiconductor layer 1005, a quantum well layer 1030, and a p-type semiconductor layer 1010 deposited on the substrate 1015. The n-type semiconductor layer 1005, the quantum well layer 1030, and the p-type semiconductor layer 1010 incorporate the active area of the quantum well modulator. In other embodiments, the p-type and n-type semiconductors are switched.

The p-type semiconductor 1010 may be a doped material that comprises one of the following materials gallium arsenide, aluminum gallium arsenide, indium gallium arsenide, silicon, germanium, and lead sulfide. The n-type semiconductor 1005 may be a doped material that comprises one of the following materials gallium arsenide, aluminum gallium arsenide, indium gallium arsenide, silicon, germanium, and lead sulfide. The quantum well layer 1030 may be an undoped semiconductor material, such as, gallium arsenide, aluminum gallium arsenide, indium gallium arsenide, silicon, germanium, and lead sulfide.

Various other layers may also be included. For example, a barrier layer, a contact layer, an etch stop layer, a spacer layer, a buffer layer, a cap layer, etc., may be included. Moreover, the layers may be deposited directly on the substrate 1015 or on an intermediate layer between the substrate and the active layers. Moreover, the substrate 1015 may be configured in any shape. For example, the substrate 1015 is not necessarily U-shaped as shown in the figure.

Various embodiments disclosed herein do not include a reflective layer on the back side of the substrate. For example, the substrate does not include a layer of gold or other reflective material. It is notable that the substrate 1015 in some embodiments, is meant to pass light within a specific bandwidth. The substrate 1015 acts as an optical filter. The substrate may block visible sun light in one embodiment. In another embodiment, the substrate allows light with a wavelength between about 1530 nm and about 1560 nm to transmit into the active area. In another embodiment, the substrate 1015 allows light with a wavelength in the infrared to pass through to the active area. In some embodiments, the substrate 1015 comprises a silicon material.

The quantum well modulator 1000 may also comprise a surface mount package. As shown in the figure, a plurality of solder balls 1050, 1055 are included. A subset of the plurality of solder balls 1050, 1055 are coupled with the active area, and a subset of the plurality of solder balls 1050, 1055 are coupled with the substrate 1015. These solder balls 1050, 1055 may also be coupled with a printed circuit board 1040.

Figure 11:
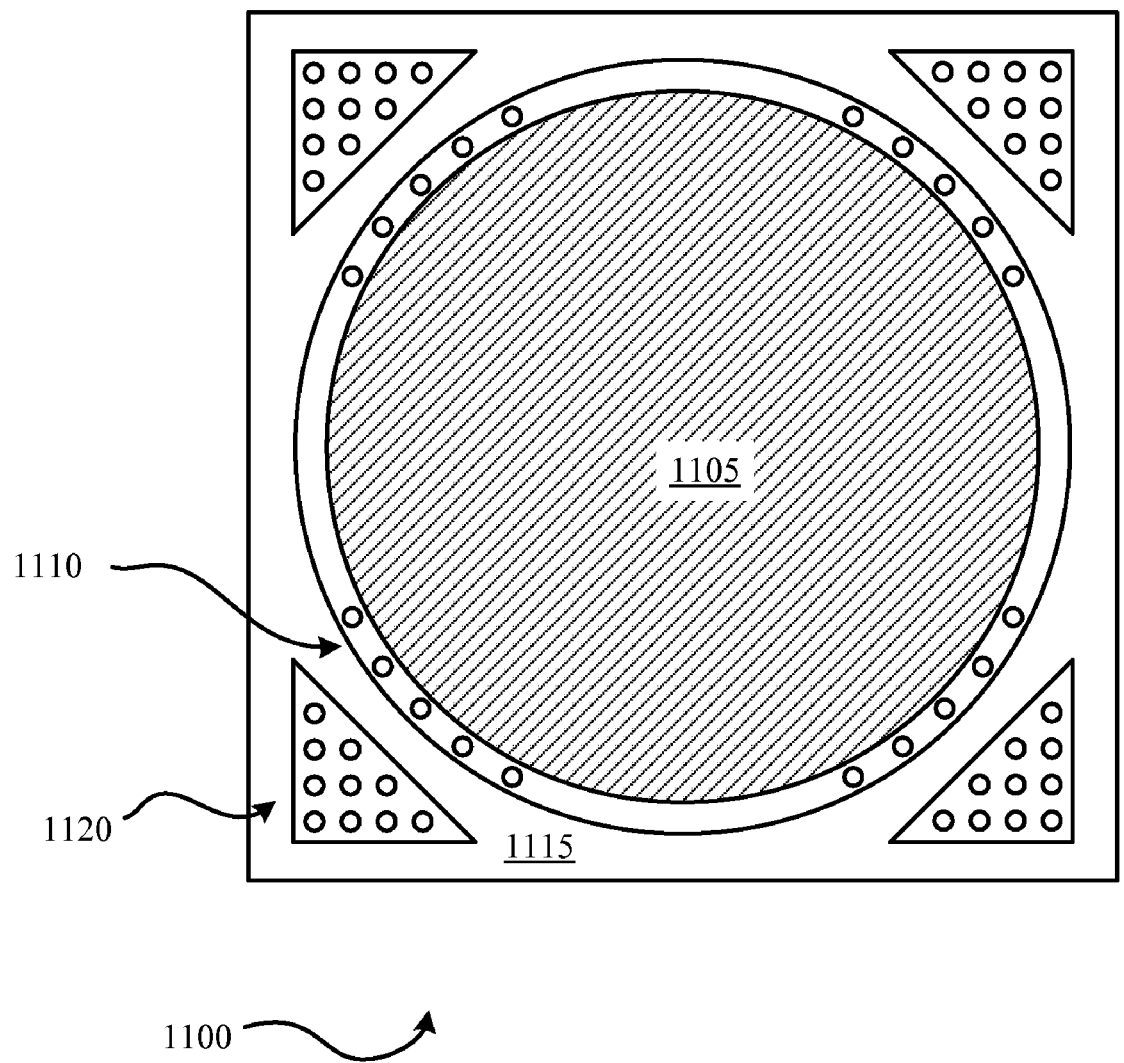
FIG. 11 shows a top view of a quantum well modulator according to one embodiment.

FIG. 11 shows a top view of a quantum well modulator 1100 according to another embodiment. The quantum well modulator 1100 includes an active area 1105 exposed within the center of the quantum well modulator 1100. As shown, the active area 1105 is circular. Moreover, the active area 1105 does not include a grid. Prior quantum well modulators include a grid on the active side. Contact bumps 1110, 1120 are shown. For example, either of the contact bumps 1110, 1120 may be coupled with either the p-type semiconductor or the n-type semiconductor. Moreover, the contact bumps 1110, 1120 may be located on the exterior of a window. The window, in some embodiments, may pass light within a specific wavelength. Moreover, the window may include the active region 1105. The substrate may be chosen, in some embodiments, depending on the wavelengths of light one chooses to pass. The contact bumps 1110, 1120 may be placed within portions of the substrate.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While the principles of the disclosure have been described above in connection with specific apparatuses and methods, it is to be clearly understood that this description is made only by way of example and not as limitation on the scope of the disclosure.

What is claimed is:

1. A modulating reflector assembly comprising:
   a body including an external surface;
   a flip-chip photodiode coupled with the body, wherein the substrate of the flip-chip photodiode is exposed to the exterior of the body;
   a reflector coupled with the body; and
   a quantum well modulator disposed between the reflector and the exterior of the body, wherein the substrate of the quantum well modulator is exposed to the exterior of the body.

2. The modulating reflector assembly according to claim 1, further comprising a modulation source communicatively coupled with the quantum well modulator.

3. The modulating reflector assembly according to claim 1, wherein the reflector comprises a retro reflector.

4. The modulating reflector assembly according to claim 1, wherein the flip-chip photodiode and the quantum well modulator are configured to receive a light beam from a transceiver.

5. The modulating reflector assembly according to claim 1, wherein the body comprises a liquid crystal polymer.

6. The modulating reflector assembly according to claim 1, wherein the substrate of the quantum well modulator is exposed to the exterior of the body, wherein the flip-chip quantum well modulator is disposed on the same external surface of the body as the flip-chip photo diode.

7. The modulating reflector assembly according to claim 1, wherein the modulating reflector assembly is hermetically sealed.

8. The modulating reflector assembly according to claim 1, further comprising a plurality of interconnects configured to couple the modulating reflector assembly with a printed circuit board.

9. The modulating reflector assembly according to claim 8, wherein the interconnects include surface mount interconnects.

10. The modulating reflector assembly according to claim 8, wherein the flip-chip photodiode is communicatively coupled with one or more of the plurality of interconnects.

11. The modulating reflector assembly according to claim 8, wherein the quantum well modulator is communicatively coupled with one or more of the plurality of interconnects.

12. A modulating reflector assembly comprising:
    a body including an external surface and comprising a liquid crystal polymer;
    a flip-chip photodiode coupled with the body, wherein the substrate of the flip-chip photodiode is exposed to the exterior of the body;
    a retro reflector coupled with the body;
    a flip-chip quantum well modulator disposed between the reflector and the exterior of the body, wherein the substrate of the quantum well modulator is exposed to the exterior of the body, wherein the flip-chip quantum well modulator is disposed on the same external surface of the body as the flip-chip photo diode; and
    a plurality of interconnects configured to couple the modulating reflector assembly with a printed circuit board.

13. The modulating reflector assembly according to claim 12, further comprising a modulation source communicatively coupled with the quantum well modulator.

14. The modulating reflector assembly according to claim 12, wherein the interconnects include surface mount interconnects.

15. The modulating reflector assembly according to claim 12, wherein the flip-chip photodiode is communicatively coupled with one or more of the plurality of interconnects.

16. The modulating reflector assembly according to claim 12, wherein the quantum well modulator is communicatively coupled with one or more of the plurality of interconnects.

17. A modulating reflector assembly comprising:
    a body including an external surface, a first window, and a second window;
    a flip-chip photodiode coupled with the body and disposed relative to the first window, wherein the substrate of the flip-chip photodiode is exposed to light from the exterior of the body through the first window;
    a retro reflector coupled with the body;
    a flip-chip quantum well modulator disposed between the reflector and the second window, wherein the substrate of the quantum well modulator is exposed to light from the exterior of the body through the second window; and
    a plurality of interconnects configured to couple the modulating reflector assembly with a printed circuit board.

18. The modulating reflector assembly according to claim 17, wherein the first window and the second window are disposed on the same surface of the body.

19. A modulating reflector assembly comprising:
    a body including an external surface and a window;
    a flip-chip photodiode coupled with the body and disposed relative to the window, wherein the substrate of the flip-chip photodiode is exposed to light from the exterior of the body through the window;
    a retro reflector coupled with the body;
    a flip-chip quantum well modulator disposed between the reflector and the window, wherein the substrate of the quantum well modulator is exposed to light from the exterior of the body through the window; and
    a plurality of interconnects configured to couple the modulating reflector assembly with a printed circuit board.

* * * * *